United States Patent [19]
Maskara et al.

[11] Patent Number: 6,159,295
[45] Date of Patent: Dec. 12, 2000

[54] LIMITED-VOLUME APPARATUS FOR FORMING THIN FILM AEROGELS ON SEMICONDUCTOR SUBSTRATES

[75] Inventors: Alok Maskara; Teresa Ramos; Douglas M. Smith, all of Albuquerque, N. Mex.

[73] Assignee: Texas Instruments Incorporated, Dallas, Tex.

[21] Appl. No.: 09/296,911

[22] Filed: Apr. 22, 1999

Related U.S. Application Data

[62] Division of application No. 08/746,697, Nov. 14, 1996
[60] Provisional application No. 60/006,852, Nov. 16, 1995, provisional application No. 60/006,853, Nov. 16, 1995, provisional application No. 60/012,764, Mar. 4, 1996, provisional application No. 60/014,005, Mar. 25, 1996, provisional application No. 60/012,800, Mar. 4, 1996, and provisional application No. 60/022,842, Jul. 31, 1996.

[51] Int. Cl.$^7$ .......................... B05C 11/00; H01L 21/316
[52] U.S. Cl. .......................... 118/688; 118/688; 118/666; 118/667; 438/787; 438/790; 438/909; 438/778
[58] Field of Search ...................... 118/688, 666, 118/667; 438/787, 790, 909, 778, 781; 427/397.7, 331

[56] References Cited

U.S. PATENT DOCUMENTS

| | | | |
|---|---|---|---|
| 5,523,615 | 6/1996 | Cho et al. ............................... | 257/632 |
| 5,807,607 | 9/1998 | Smith et al. ............................. | 427/96 |
| 6,037,277 | 3/2000 | Masakara et al. ...................... | 438/787 |

OTHER PUBLICATIONS

Application No. 08/746,680 filed Nov. 14, 1996 now U.S. Patent 6,037,277.

*Primary Examiner*—John F. Niebling
*Assistant Examiner*—Alexander G. Ghyka
*Attorney, Agent, or Firm*—David Denker; Wade James Brady III; Frederick J. Telecky, Jr.

[57] ABSTRACT

An apparatus and method for forming thin film aerogels on semiconductor substrates is disclosed. It has been found that in order to produce defect-free nanoporous dielectrics with a controllable high porosity, it is preferable to substantially limit evaporation and condensation of pore fluid in the wet gel thin film, e.g. during gelation, during aging, and at other points prior to obtaining a dried gel. The present invention simplifies the atmospheric control needed to prevent evaporation and condensation by restricting the atmosphere in contact with the wet gel thin film to an extremely small volume. In one embodiment, a substrate 26 is held between a substrate holder 36 and a parallel plate 22, such that a substantially sealed chamber 32 exists between substrate surface 28 and chamber surface 30. Preferably, the average clearance between surfaces 28 and 30 is less than 5 mm, or more preferably, less than 1 mm. Temperature control means 34 may optionally be used to control the temperature in chamber 32. In operation, the atmosphere in chamber 32 becomes saturated by an extremely small amount of pore fluid evaporated from a wet gel thin film on surface 28, thus preventing further evaporation or condensation. This invention is ideally suited for rapid aging of thin film wet gels.

16 Claims, 10 Drawing Sheets

LIMITED-VOLUME APPARATUS FOR FORMING THIN FILM AEROGELS ON SEMICONDUCTOR SUBSTRATES

This application is a divisional of application Ser. No. 08/746,697 filed Nov. 14, 1996, which claims priority from provisional applications 60/006,852, filed Nov. 16, 1995; 60/006,853, filed Nov. 16, 1995; 60/012,764, filed Mar. 4, 1996; 60/014,005 filed Mar. 25, 1996; 60/012,800, filed Mar. 4, 1996; and 60/022,842, filed Jul. 31, 1996.

FIELD OF THE INVENTION

This invention pertains generally to deposition tools and methods for forming porous thin films on semiconductor substrates, and more specifically to tools and methods for aging and drying wet gel thin films during the fabrication of nanoporous dielectrics.

BACKGROUND OF THE INVENTION

Nanoporous dielectrics are some of the most promising new materials for semiconductor fabrication. These dielectric materials contain a solid structure, for example of silica, which is permeated with an interconnected network of pores having diameters typically on the order of a few nanometers. These materials may be formed with extremely high porosities, with corresponding dielectric constants typically less than half the dielectric constant of dense silica. And yet despite their high porosity, it has been found that nanoporous dielectrics may be fabricated which have high strength and excellent comparability with most existing semiconductor fabrication processes. Thus nanoporous dielectrics offer a viable low-dielectric constant replacement for common semiconductor dielectrics such as dense silica.

The preferred method for forming nanoporous dielectrics is through the use of sol-gel techniques. The word sol-gel does not describe a product but a reaction mechanism whereby a sol, which is a colloidal suspension of solid particles in a liquid, transforms into a gel due to growth and interconnection of the solid particles. One theory is that through continued reactions within the sol, one or more molecules in the sol may eventually reach macroscopic dimensions so that it/they form a solid network which extends substantially throughout the sol. At this point (called the gel point), the substance is said to be a gel By this definition, a gel is a substance that contains a continuous solid skeleton enclosing a continuous liquid phase. As the skeleton is porous, the term "gel" as used herein means an open-pored solid structure enclosing a pore fluid.

One method of forming a sol is through hydrolysis and condensation reactions, which can cause a multifunctional monomer in a solution to polymerize into relatively large, highly branched particles. Many monomers suitable for such polymerization are metal alkoxides. For example, a tetra-ethylorthosilicate (TEOS) monomer may be partially hydrolyzed in water by the reaction $$Si(OEt)_4 + H_2O \rightarrow HO—Si(OEt)_3 + EtOH$$

Reaction conditions may be controlled such that, on the average, each monomer undergoes a desired number of hydrolysis reactions to partially or fully hydrolyze the monomer. TEOS which has been fully hydrolyzed becomes $Si(OH)_4$. Once a molecule has been at least partially hydrolyzed, two molecules can then link together in a condensation reaction, such as $$(OEt)_3Si—OH + HO—Si(OH)_3 \rightarrow (OEt)_3Si—O—Si(OH)_3 + H_2O$$

or $$(OEt)_3Si—OEt + HO—Si(OEt)_3 \rightarrow (OEt)_3Si—O—Si(OEt)_3 + EtOH$$

to form an oligomer and liberate a molecule of water or ethanol. The Si—O—Si configuration in the oligomer formed by these reactions has three sites available at each end for further hydrolysis and condensation. Thus, additional monomers or oligomers can be added to this molecule in a somewhat random fashion to create a highly branched polymeric molecule from literally thousands of monomers. An oligomerized metal alkoxide, as defined herein, comprises molecules formed from at least two alkoxide monomers, but does not comprise a gel.

Sol-gel reactions forms the basis for xerogel and aerogel film deposition. In a typical thin film xerogel process, an ungelled precursor sol may be applied (e.g., spray coated, dip-coated, or spin-coated) to a substrate to form a thin film on the order of several microns or less in thickness, gelled, and dried. The precursor sol often comprises a stock solution and a solvent, and possibly also a gelation catalyst that modifies the pH of the precursor sol in order to speed gelation. During and after coating, the volatile components in the sol thin film are usually allowed to rapidly evaporate. Thus, the deposition, gelation, and drying phases may take place simultaneously (at least to some degree) as the film collapses rapidly to a dense film. In contrast, an aerogel process differs from a xerogel process largely by avoiding pore collapse during drying of the wet gel. Some methods for avoiding pore collapse include wet gel treatment with condensation-inhibiting modifying agents (as described in U.S. Pat. No. 5,470,802, *A Low Dielectric Constant Material For Electronics Applications*, issued on Nov. 28, 1995 to Gnade, Cho and Smith), supercritical pore fluid extraction, and freeze-drying.

Aerogels are the preferable of the two dried gel materials for semiconductor thin film dielectric applications. Typical thin film xerogel methods produce films having limited porosity (up to 60% with large pore sizes, but generally substantially less than 50% with pore sizes useful in sub-micron semiconductor fabrication). An aerogel thin film, on the other hand, may be formed with almost any desired porosity coupled with a very fine pore size. Preferably, for semiconductor applications these nanoporous materials have average pore sizes less than 50 nm (and more preferably less than 10 nanometers and still more preferably less than 5 nanometers). The nanoporous inorganic dielectrics include the nanoporous metal oxides, particularly nanoporous silica.

SUMMARY OF THE INVENTION

It has now been found that in the production of nanoporous dielectrics it is preferable to subject the wet gel thin film to a process known as aging. Hydrolysis and condensation reactions do not stop at the gel point, but continue to restructure, or age, the gel until the reactions are purposely halted. It is believed that during aging, preferential dissolution and redeposition of portions of the solid structure produces beneficial results, including higher strength, greater uniformity of pore size, and a greater ability to resist pore collapse during drying. However, aging a wet gel in thin film form is difficult, as the film contains an extremely small amount of pore fluid that must be held fairly constant for a period of time in order for aging to occur. If pore fluid evaporates from the film before aging has strengthened the network, the film will tend to densify in xerogel fashion. On the other hand, if excess pore fluid condenses from the atmosphere onto the thin film before the network has been strengthened, this may locally disrupt the aging process and cause film defects.

It has now been found that some method of pore fluid evaporation rate control during aging is beneficial to aerogel thin film fabrication. In principle, evaporation rate control during aging can be accomplished by actively controlling the pore fluid vapor concentration above the wafer. However, the total amount of pore fluid contained in, for instance, a 1 μm thick 70% porous wet gel deposited on a 150 mm wafer is only about 0.012 ml, an amount that would easily fit in a single 3 mm diameter drop of fluid. Actively controlling the pore fluid vapor concentration (by adding or removing solvent to the atmosphere) to allow no more than, e.g., 1% pore fluid evaporation during aging presents a difficult proposition; the surface area of the thin film is high and the allowable tolerance for pore fluid variations is extremely small. In particular, evaporation and condensation control are especially important for rapid aging at elevated temperature, where production processes have heretofore apparently not been practically possible.

The present invention, in its simplest form, overcomes the evaporation rate control problem by not attempting to actively control pore fluid vapor concentration above a wafer at all; instead, the wafer is processed in an extremely low-volume chamber, such that through natural evaporation of a relatively small amount of the pore fluid contained in the wet gel film, the processing atmosphere becomes substantially saturated in pore fluid. Unless the wafer is cooled at some point in a substantially saturated processing atmosphere, this method also naturally avoids problems with condensation, which should generally be avoided, particularly during high temperature processing.

In accordance with the present invention, a method is presented for post-deposition processing (e.g. gelation, aging, and/or drying) of a wet gel thin film deposited on a semiconductor substrate. This method comprises the step of placing a substrate in a preferably substantially sealed chamber, where the substrate has a wet gel thin film, wetted by at least a first pore fluid, deposited thereon. The first pore fluid preferably principally comprises a polyol. The chamber is preferably not pressurized or uses at most a moderate overpressure such that there is little or no leakage, and atmospheric flow is generally avoided. This method further generally utilizes controlling the chamber at a temperature selected in the range of between 25° C. and 200° C. (and more preferably between 80° C. and 150° C.), with the temperature selected such that less than 5% (preferably less than 1%, and more preferably less than 0.5%) of the first pore fluid contained in the wet gel thin film is required to substantially saturate the atmosphere in the chamber.

Preferably, the step of controlling the chamber temperature comprises ramping the chamber to a specified temperature and holding the chamber at that temperature for a time period, e.g. such that the film is aged. After sufficient aging, the fluid can be evaporated.

In another aspect of the invention, an apparatus for processing a sol or wet gel thin film deposited on a substrate is disclosed. This apparatus comprises a body capable of substantially enclosing at least a first region of a substrate surface, where the first region has a sol or wet gel thin film deposited thereon. The body preferably has a chamber surface capable of being positioned substantially adjacent to the thin film without contacting the thin film, thus forming an extremely low-volume atmospheric chamber adjacent the thin film. The apparatus also preferably comprises some means for controlling the temperature within the chamber.

The low-volume chamber may be designed to have a volume relative to the volume of the wet gel film to be processed; e.g., generally less than or equal to 5000 times the volume of the thin film in the first region, or more preferably less than or equal to 1000 times greater, or still more preferably less than 500 times greater. Alternately, the chamber volume may be designed with a specific pore fluid, pore fluid volume and processing temperature in mind, such that less than a specified percentage of the pore fluid is required to substantially saturate the atmospheric chamber. Some specific designs have chamber surfaces which may be positioned to within 5 mm or even to within 1 mm or less of the thin film.

Dried gels produced with this simple thin film aerogel fabrication process and apparatus can be used in many applications. Some of these uses may not have been cost effective using prior art methods. These uses include low dielectric constant thin films (particularly on semiconductor substrates), miniaturized chemical sensors, thermal isolation structures, and thermal isolation layers (including thermal isolation structures for infrared detectors). As a general rule, many low dielectric constant thin films prefer porosities greater than 60%, with critical applications preferring porosities greater than 80 or 90%, thus giving a substantial reduction in dielectric constant. However, structural strength and integrity considerations may limit the practical porosity to no more than 90%. Some applications, including thermal isolation structures and thermal isolation layers, may need to sacrifice some porosity for higher strength and stiffness.

The term "thin film" as used herein refers to a film having an average thickness of less than 2 microns. It should be noted that the present invention is generally not applicable to bulk gel processing, where evaporation poses substantially different problems. For example, pore fluid evaporation during aging is generally not a problem in bulk gel processing, since the ratio of surface area to fluid volume may be four or five orders of magnitude less than the same ratio for a thin film. By the same token, however, high-viscosity, low-vapor pressure pore fluids, preferred for thin film applications, are extremely difficult to dry or solvent exchange from a bulk gel, and are generally not used in bulk gel applications.

BRIEF DESCRIPTION OF THE DRAWING

The present invention, including various features and advantages thereof, may be best understood with reference to the following drawing, wherein.

DETAILED DESCRIPTION OF THE PREFERRED EMBODIMENTS

Several recent advances have resulted in more commercially viable aging processes for aerogel thin films. These include multi-solvent sol precursors, low-volatility polyol-based sol precursors, and rapid aging techniques. For example, in one preferred system, all three of these improvements are combined. A multi-solvent sol precursor comprises a first polyol solvent having a low volatility, which is used to control gel density and pore fluid evaporation, and a second solvent (e.g. ethanol) having a low viscosity and a relatively high volatility, which is used to control pre-deposition reaction rate and to allow uniform coating. Preferably the low volatility solvent is one with a boiling point in the 175–300° C. range and (for TEOS based gels) is miscible with both water and ethanol. Some suitable polyols are trihydric alcohols, such as glycerol, and dihydric alcohols (glycols), such as ethylene glycol, 1,4-butylene glycol, and 1,5-pentanediol. The low volatility solvent is preferably principally ("principally" as used herein means 50% or greater by volume) comprises the aging fluid in this system, such that a wet gel thin film may be aged at elevated temperature for a relatively short time period.

Figure 1:
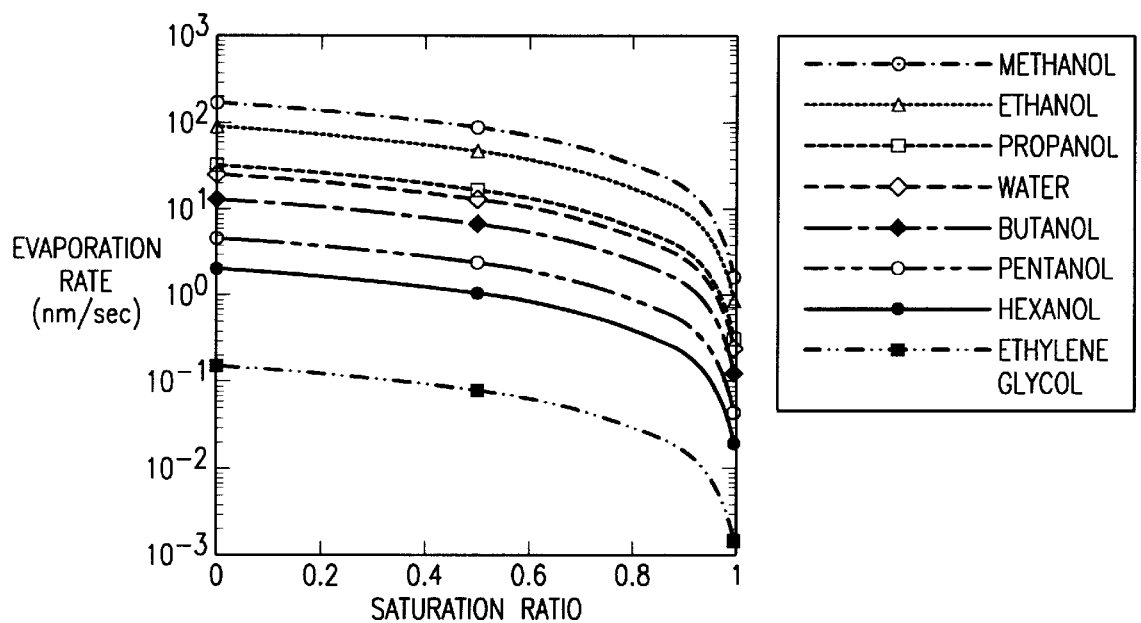
FIG. 1 contains a graph of the variation of evaporation rate with saturation ratio and solvent type.

Even with such a system, it has now been found to be desirable to at least age a wet gel thin film under controlled atmospheric conditions. In an effort to better understand solvent evaporation from thin film wet gels, we have modeled isothermal solvent vaporization from a wafer as a function of percent saturation. This modeling is based on basic mass transfer theory. *Transport Phenomena*, (particularly Chapters 16 and 17) by R. B. Bird, W. E. Stewart, and E. N. Lightfoot, is a good reference for mass transfer theory. Calculations were performed for a range of solvents, and the ambient temperature evaporation rates for some of these solvents are given in FIG. 1.

For evaporation to not be a processing problem, the product of the evaporation rate and processing time (preferably on the order of minutes) must be significantly less than the film thickness. This suggests that for solvents such as ethanol, the atmosphere above the wafer would have to be maintained at over 99% saturation. However, there can be problems associated with allowing the atmosphere to reach saturation or supersaturation. Some of these problems are related to condensation of an atmospheric constituent upon the thin film. Condensation on either the gelled or ungelled thin film has been found to cause defects in an insufficiently aged film. Thus, it is generally desirable to avoid actively controlling the atmosphere's degree of solvent saturation.

Figure 5:
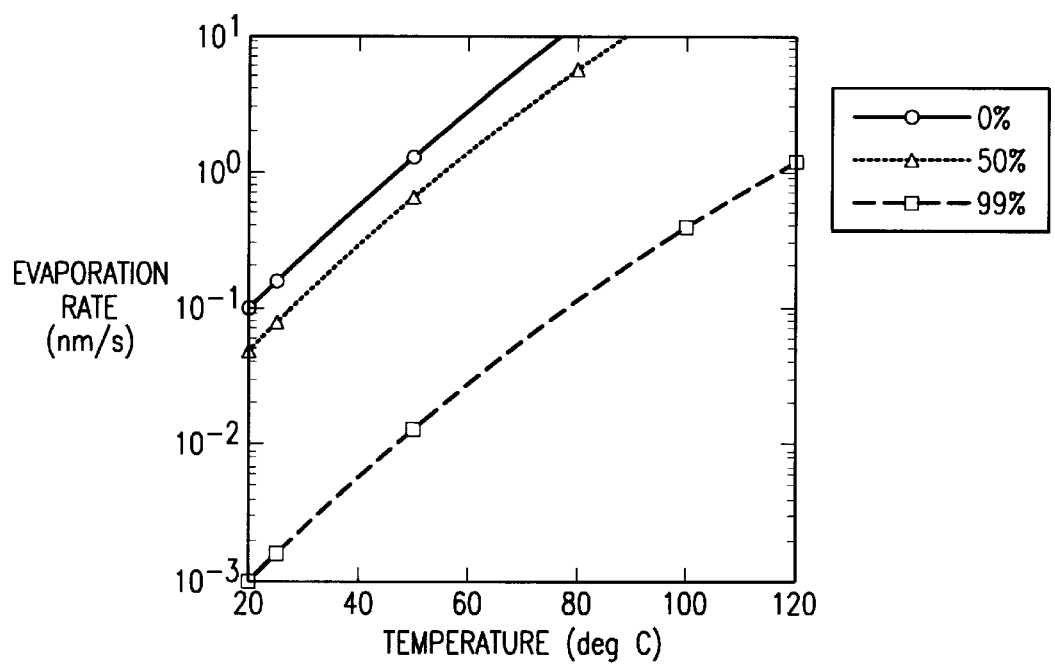
FIG. 5 contains a graph of the evaporation rate for ethylene glycol as a function of temperature and atmospheric saturation ratio.
Figure 11:
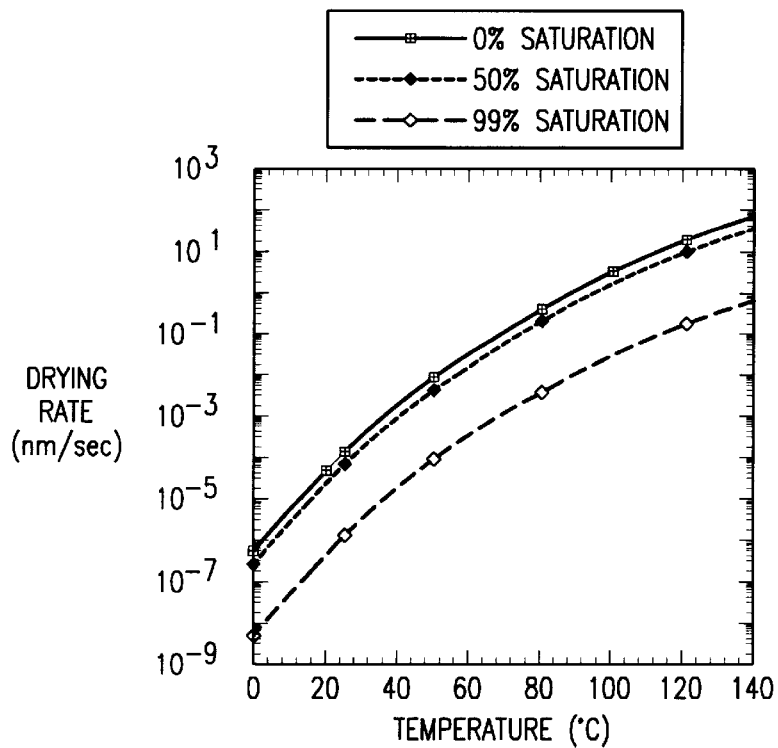
FIG. 11 contains a graph of the evaporation rate for glycerol a function of temperature and atmospheric saturation ratio.

The use of a polyol allows a loosening (as compared to prior art solvents) of the required atmospheric control during deposition and/or gelation. This is because that even though supersaturation should still generally be avoided, the atmospheric solvent concentration need not be controlled to avoid excessive evaporation. FIG. 5 shows how the evaporation rate of ethylene glycol varies with temperature and atmospheric solvent concentration. FIG. 11 shows how the evaporation rate of glycerol varies with temperature and atmospheric solvent concentration. It has been our experience that, with polyols, acceptable gels can be formed by depositing and gelling in an uncontrolled or a substantially uncontrolled atmosphere ("uncontrolled" is used herein to mean without actively controlling the solvent concentration in the atmosphere). In the most preferred approach, deposition and gelation typically require only standard cleanroom temperature and humidity controls, although the wafer and/or precursor sol may have independent temperature controls.

One attractive feature of using a polyol as a solvent is that at ambient temperature, the evaporation rate is sufficiently low so that several seconds at ambient conditions will not yield dramatic shrinkage for thin films. However, in addition to serving as a low vapor pressure and water-miscible solvent, polyols may also participate in sol-gel reactions. Although the exact reactions in this process have not been fully studied, some reactions can be predicted. If tetraethoxysilane (TEOS) is employed as a precursor with an ethylene glycol solvent, the ethylene glycol can exchange with the ethoxy groups:

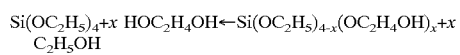

Similarly, if tetraethoxysilane (TEOS) is employed as a precursor with a glycerol solvent, the glycerol can exchange with the ethoxy groups:

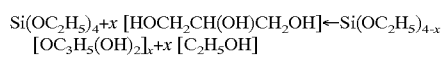

In principle, the presence and concentration of these chemical groups can change the precursor reactivity (i.e., gel time), modify the gel microstructure (surface area, pore size distribution, etc.), change the aging characteristics, or change nearly any other characteristic of the gel.

Ethylene glycol and glycerol may react with TEOS and produce a dried gel with surprisingly different properties than that of an ethanol/TEOS gel. Unanticipated property changes in the ethylene glycol/TEOS based gels and the glycerol/TEOS based gels generally include (at least on most formulations):

Lower density, achievable without supercritical drying or pre-drying surface modification Shorter gel times at a given catalyst content Strengths of bulk samples which are approximately an order of magnitude greater (at a given density) than conventional TEOS gels Very high surface area (~1,000 $m^2/g$)

High optical clarity of bulk samples (likely due to a narrower pore size distribution than conventional TEOS gels)

Low Density

Figure 6:
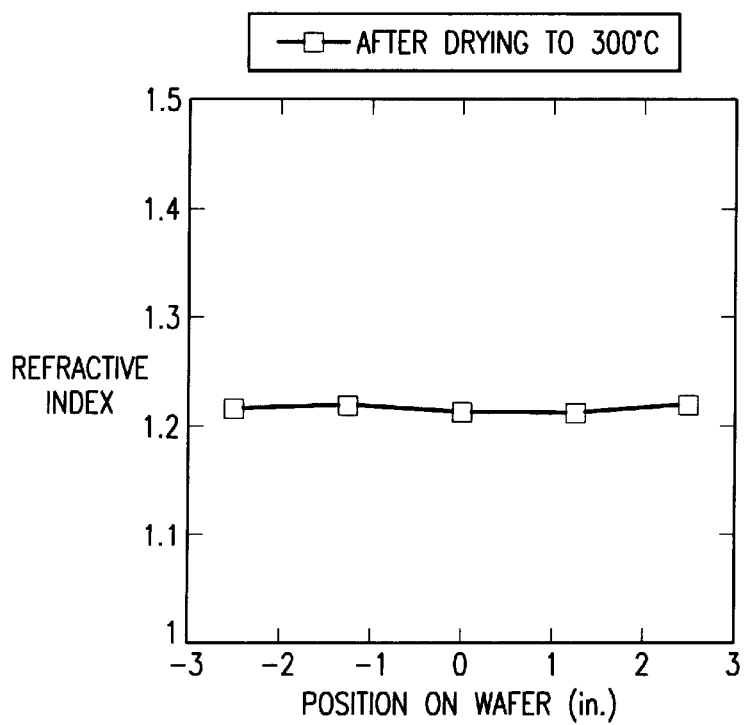
FIG. 6 contains a graph of the variation in refractive index during processing for a film produced using a 60/40 ethylene glycol/ethanol solution with a substantially uncontrolled atmosphere.
Figure 7:
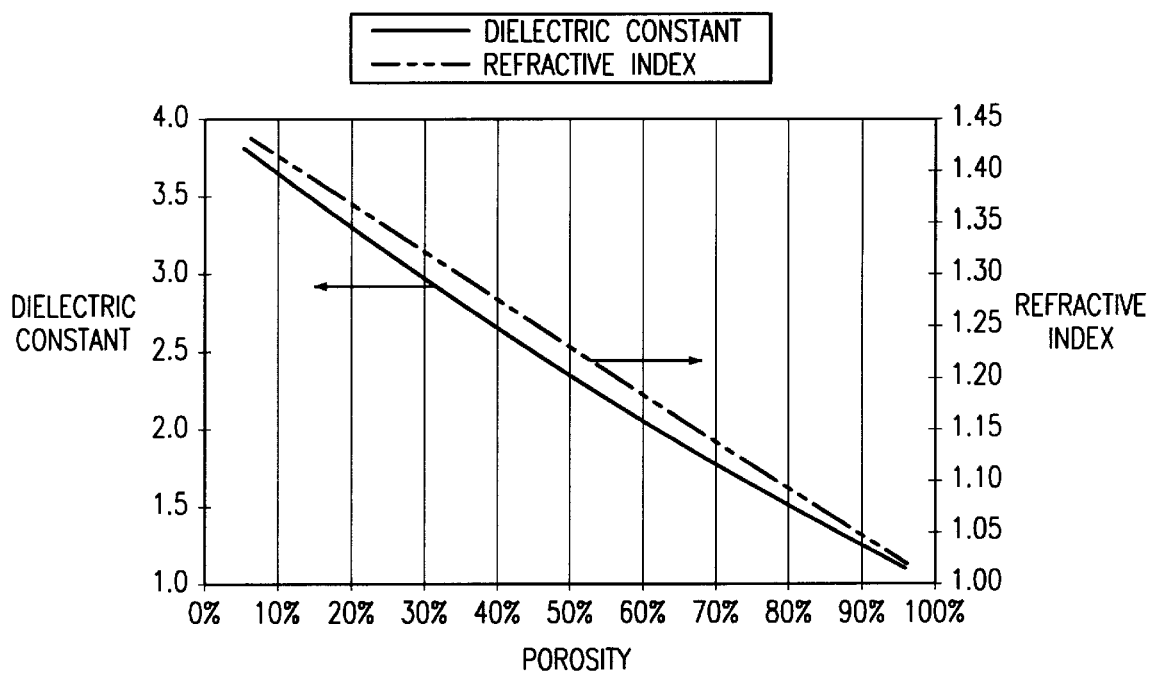
FIG. 7 contains a graph of the theoretical relationship between porosity, refractive index, and dielectric constant for nanoporous silica dielectrics.

With polyol solvent systems, it is possible to form dried gels at very low densities without pre-drying surface modification or supercritical drying. These low densities can generally be down around 0.3 to 0.2 $g/cm^3$ (non-porous $SiO_2$ has a density of 2.2 $g/cm^3$), or with care, around 0.1 $g/cm^3$. Stated in terms of porosity (porosity is the percentage of a structure which is hollow), this denotes porosities of about 86% and 91% (about 95% porosity with a density of 0.1 $g/cm^3$). As shown in FIG. 7, these porosities correspond to dielectric constants of about 1.4 for the 86% porous, and 1.2 for 91% porous. The actual mechanism that allows these high porosities is not fully known. However, it may be because the gels have high mechanical strength, because the gels do not have as many surface OH (hydroxyl) groups, a combination of these, or some other factors. This method also obtains excellent uniformity across the wafer. FIG. 6 shows the refractive index (and thus generally the porosity) at several locations on a sample semiconductor substrate.

If desired, this process can be adjusted (by varying the TEOS/solvent ratios) to give any porosity from above 90% down to about 20%, or even 10%. Typical prior art dried gels with small pore sizes required either supercritical drying or a surface modification step before drying to achieve these low densities. While some prior art xerogels have porosities greater than 50%, these prior art xerogels had substantially larger pore sizes (typically above 100 nm). These large pore size gels have less mechanical strength. Additionally, their large pore size makes them unsuitable for filling small (typically less than 1 $\mu$m) patterned gaps on a microcircuit.

Density Prediction

By varying the ratio of ethylene glycol (EG) to ethanol (EtOH) in the precursor (at a fixed silica content), the density after ethanol/water evaporation can be calculated. This is likely due to the low volatility of the second solvent. To the extent that further shrinkage is prevented during aging and drying, this allows prediction of the density (and thus porosity) of the dried gel. Although this density prediction had generally not been a large problem with bulk gels, thin film gels had typically needed excellent atmospheric controls to enable consistent density predictions. Table 1 shows the predicted and actual density for three different EG/EtOH ratios after substantial ethanol and water removal, but before drying (EG removal).

TABLE 1

Correlation between predicted and measured density of wet bulk gels after ethanol/water evaporation.

| Stock Solution | Predicted Density ($g/cm^3$) | Measured Density ($g/cm^3$) after drying @ 80° C. |
|---|---|---|
| 40% EtOH/60% EG | 0.37 | 0.40 |
| 51% EtOH/49% EG | 0.43 | 0.45 |
| 60% EtOH/40% EG | 0.53 | 0.50 |

To some degree, the glycerol-based processes behave similarly to the ethylene glycol-based processes. The glycerol-based gels have dramatically lower evaporation and shrinkage rates during aging. This allows atmospheric control to be loosened during aging. We have fabricated acceptable glycerol-based gels with no atmospheric controls during aging.

Shorter Gel Times

Figure 2:
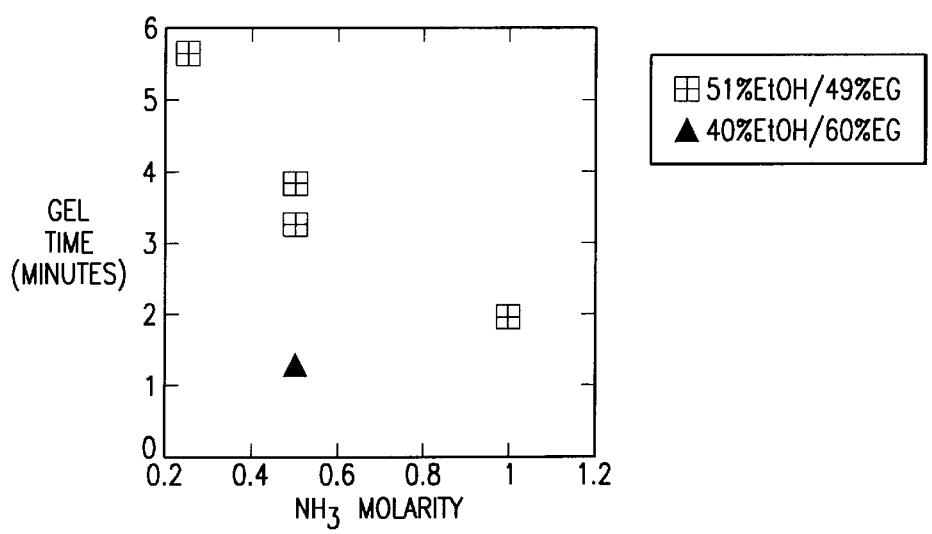
FIG. 2 contains a graph of the change in gel times (without solvent evaporation) for bulk ethylene glycol-based gels as a function of base catalyst.

In addition to enabling prediction of the density, the use of polyols may also change other properties of the sol-gel process. FIG. 2 shows gel times for two different ethylene glycol-based compositions as a function of the amount of ammonia catalyst used. These gel times are for bulk gels for which there is no evaporation of ethanol and/or water as there would be for thin films. Evaporation increases the silica content and thus decreases the gel time. Therefore, these gels times may be the upper limit for a given precursor/catalyst. The gel times reported in FIG. 2 are approximately an order of magnitude shorter than precursors without a polyol. Gel times are generally also a first order dependence on the concentration of ammonia catalyst. This implies that it may be possible to easily control the gel times. For thin films of these new polyol-based gels, it is routine to obtain gelation within minutes, even without a gelation catalyst.

Higher Strength

Figure 3:
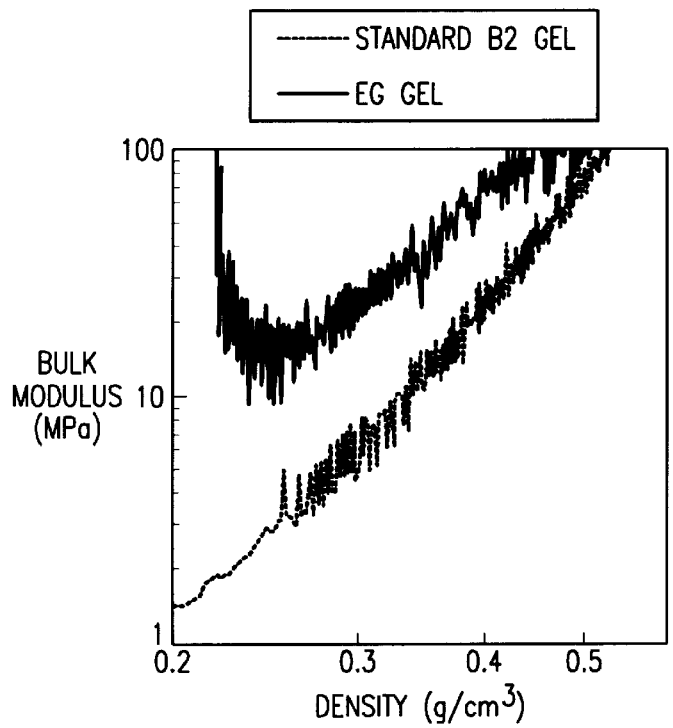
FIG. 3 contains a graph of the variation of modulus with density for a non-glycol-based gel and an ethylene glycol-based gel.

The properties of the polyol-based samples appear to be quite different from regular gels as evidenced by both a low degree of drying shrinkage and differences in qualitative handling of the wet and dry gels. Thus, upon physical inspection, both the glycerol-based and ethylene glycol-based dried gels seem to have improved mechanical properties as compared to conventional dried gels. FIG. 3 shows the bulk modulus measured during isostatic compaction measurements of one sample prepared using one ethylene glycol-based and one conventional ethanol-based dried bulk gel (both have the same initial density). After initial changes attributed to buckling of the structure, both samples exhibit power law dependence of modulus with density. This power law dependence is usually observed in dried gels. However, what is surprising is the strength of the ethylene glycol-based dried gel. At a given density (and thus, dielectric constant), the modulus of the ethylene glycol based gel is an order of magnitude higher than the conventional precursor gel. The glycerol-based gels also seem to have a high strength; generally, the strength is at least as good as the ethylene glycol-based gels. The reasons for this strength increase are unclear but correspondingly may be related to the very high surface area of these dried gels (>1,000 $m^2/g$) and the seemingly narrow pore size distribution.

High Surface Area

We measured the surface areas of some dried bulk gels. These surface areas were on the order of 1,000 m²/g, as compared to our typical dried gels which have surface area in the 600–800 m²/g range. These higher surface areas imply smaller pore size which may lead to improved mechanical properties. It is unclear at this time why these higher surface areas are obtained with the polyol-based dried gels.

Pore Size Distribution

The optical clarity of these dried bulk gels was greater than any dried gels at this density that we have previously made. It is possible that this excellent optical clarity is due to a very narrow pore size distribution. However, it is unclear why the polyols have this effect. It is still not clear whether the apparently narrow pore size distribution is a result of a different microstructure at the gelation stage or differences in aging. Preliminary measurements on a bulk gel sample (with a density of about 0.22 g/cm³) showed that the mean pore diameter was 16.8 nm.

As shown above, some properties of the polyol-based gels apply to both bulk gels and thin films. However, some advantages are most evident when applied to thin films, such as nanoporous dielectric films on semiconductor wafers. One important advantage is that this new method allows high quality nanoporous films to be processed with no atmospheric controls during deposition or gelation.

guidelines for acceptable thickness loss exist, one proposed guideline, for some microcircuit applications such as nanoporous dielectrics, is that the thickness losses should be less than 2% of the film thickness. For a hypothetical nominal film thickness of 1 μm (actual film thicknesses may typically vary from significantly less than 0.5 μm to several 1 μm thick), this gives an allowable thickness loss of 20 nm. As shown in Table 3, the glycerol-based gels (and other polyol-based gels with low vapor pressures) can achieve this preliminary goal without atmospheric control at room temperature. However, other solvent systems and/or higher temperature aging require at least some degree of atmospheric control.

TABLE 2

Approximate Aging Time as a Function of Temperature For Some Polyol-Based Gels

| Aging Temperature (Degrees C.) | Aging Time For Polyol-Based Gels (Order of Magnitude Approximations) |
| --- | --- |
| 25 | 1 day |
| 100 | 5 minutes |
| 140 | 1 minute |

TABLE 3

Approximate Thickness Loss During Aging vs. Saturation Ratio.

Thickness Loss During Aging

| Aging Time/ Temperature | Ethanol-Based Gel % Saturation | | | EG-Based Gel % Saturation | | | Glycerol-Based Gel % Saturation | | |
| --- | --- | --- | --- | --- | --- | --- | --- | --- | --- |
| | 0% | 50% | 99% | 0% | 50% | 99% | 0% | 50% | 99% |
| 1 day/ 25° C. | 8 mm | 7 mm | 86 μm | 17 μm | 7 μm | 172 nm | 13 nm | 5 nm | .1 nm |
| 300 sec/ 100° C. | — | — | — | 3 μm | 1.2 μm | 90 nm | 600 nm | 420 nm | 9 nm |
| 60 sec/ 140° C. | — | — | — | — | — | — | 6 μm | 3 μm | 60 nm |

Although it is important to be able to deposit and gel thin nanoporous films without atmospheric controls, it is also desirable to age thin nanoporous films without complicated atmospheric controls. It has been discovered that this presents a bigger challenge than deposition. The primary reason is that while deposition and room temperature gelation can take place in minutes, or even seconds; room temperature aging typically requires many hours. Thus, an evaporation rate that provides acceptable shrinkage for a short process, may cause unacceptable shrinkage when the process times are lengthened by an order of magnitude (and/or if processing temperatures are raised).

Figure 4:
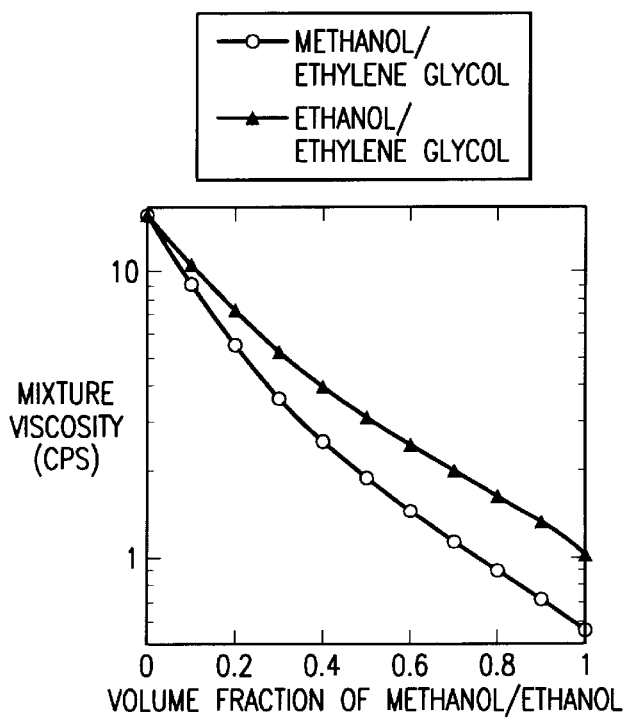
FIG. 4 contains a graph of the viscosity variation as a function of alcohol volume fraction for ethylene glycol/alcohol mixtures.

As an example, we have found that with some polyol-based gels, such as the ethylene glycol- and glycerol-based gels, a satisfactory aging time at room temperature is on the order of a day. However, Table 2 shows that, by using higher temperatures, we can age with times on the order of minutes. Thus, when these times and temperatures are combined with the evaporation rates of FIG. 1, FIG. 5, and FIG. 11, they give the approximate thickness loss during aging as shown in Table S. These estimated thickness losses need to be compared with acceptable thickness losses. While no firm One disadvantage of polyols, especially trihydric alcohols and other higher viscosity polyols, are their relatively high viscosities which could cause problems with gap-filling and/or planarization. As described in copending U.S. patent application serial # TBD (Attorney's Docket TI-21623), titled *Aerogel Thin Film Formation From Multi-Solvent Systems*, by Smith et al., a low viscosity, high volatility solvent can be used to lower the viscosity. FIG. 4 shows the calculated viscosity of some ethylene glycol/alcohol and glycerol/alcohol mixtures at room temperature. As the figure shows, a small quantity of alcohol significantly reduces the viscosity of these mixtures. Also, if the viscosity using 10 ethanol in the stock solution is higher than desired, further improvement can be realized by employing methanol and tetramethoxysilane in the precursor solution. The viscosities reported in FIG. 4 are for pure fluid mixtures only. In fact, depending upon the film precursor solution, the precursor solution might contain glycerol, alcohol, water, acid and partially reacted metal alkoxides. After refluxing, but before catalysis, the measured viscosity as a function of ethylene glycol content is shown in Table 4. As predicted, the use of methanol significantly lowers the viscosity. Of course, the viscosity can be increased before deposition by catalyzing the condensation reaction and hence, the values reported in Table 4 represent lower bounds.

TABLE 4

Measured Viscosity and Density of Glycol-Based Stock Solutions Before Activation.

| Stock Solution "Solvent" | Viscosity @25° C. (cp) | Viscosity @40° C. (cp) |
|---|---|---|
| 100% EtOH | 1.5 | — |
| 40% Ethylene glycol/60% EtOH | 3.1 | — |
| 49% Ethylene glycol/51% EtOH | 4.0 | — |
| 60% Ethylene glycol/40% EtOH | 5.4 | — |
| 40% Ethylene glycol/60% Methanol | 1.6 | — |
| 100% Ethylene glycol | 11.0 | 7.8 |
| 40% Glycerol/60% EtOH | 5.8 | — |
| 50% Glycerol/50% EtOH | 9.0 | — |
| 60% Glycerol/40% EtOH | 15.5 | — |
| 100% Glycerol | 1000. | 7.8 |

This multi-solvent approach may be combined with or replaced with an alternative approach. This alternate approach uses elevated temperatures to reduce the sol viscosity during application. For example, the measured viscosity of the TEOS/ethylene glycol/water/nitric acid precursor described in the second preferred embodiment is 11 centipoise (cp) at 25 degrees C., but only 7.8 cp at 40 degrees C. Thus by heating and/or diluting the precursor during deposition, (such as by heating the transfer line and deposition nozzle of a wafer spin station) the viscosity of the precursor sol can be lowered to nearly any given viscosity. Not only does this preheat lower the sol viscosity, it may also speed gel times and accelerate the evaporation of any high volatility solvents. It may also be desirable to preheat the wafer. This wafer preheat should improve process control and may improve gap fill, particularly for the more viscous precursors. However, for many applications, wafer preheat is not required, thus simplifying process flows. When using a spin-on application method with this no wafer preheat approach, the spin station would not require a temperature controlled spinner.

Figure 12:
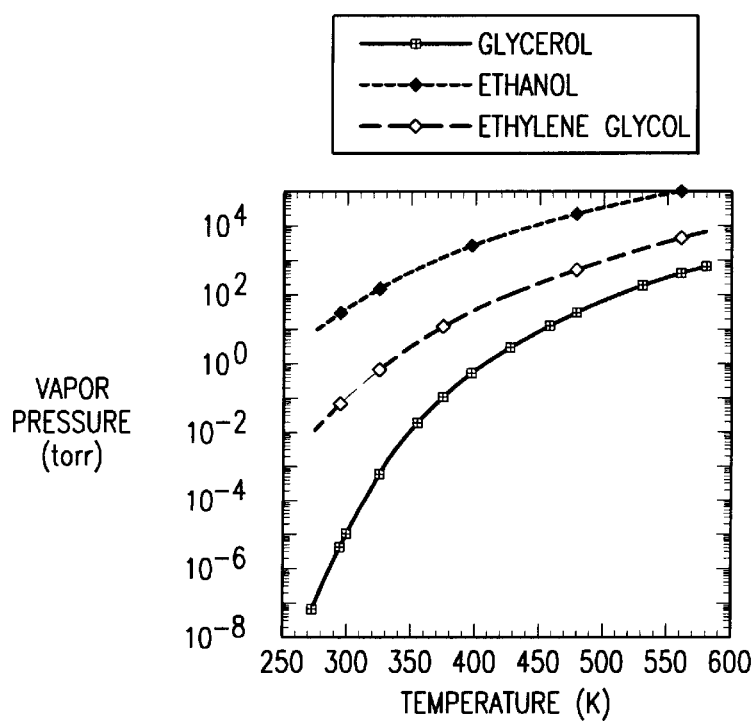
FIG. 12 contains a graph showing change in vapor pressure with temperature.
Figure 13:
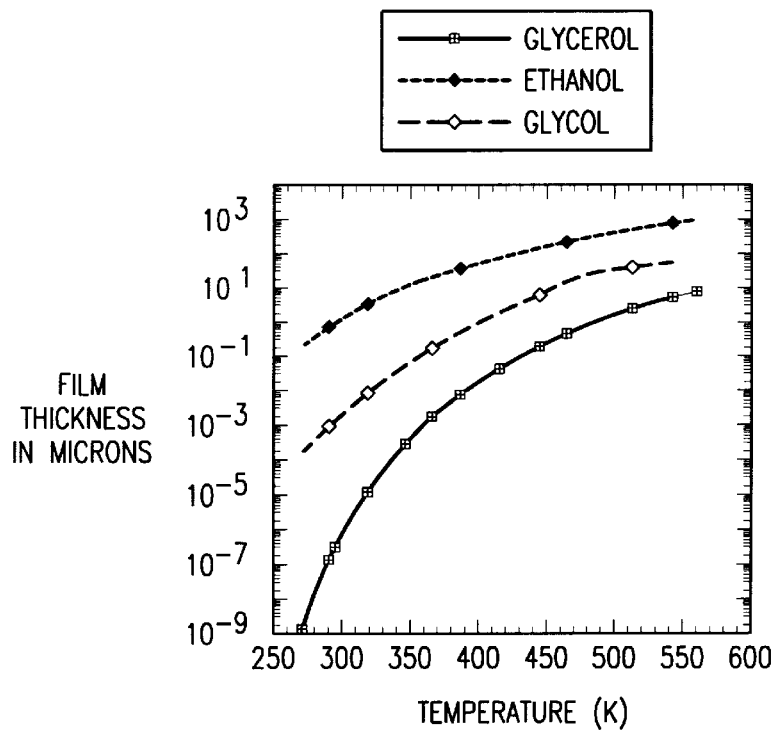
FIG. 13 contains a graph showing the shrinkage of a thin film when aged in a substantially closed chamber having a 5 mm clearance with the thin film.
Figure 14:
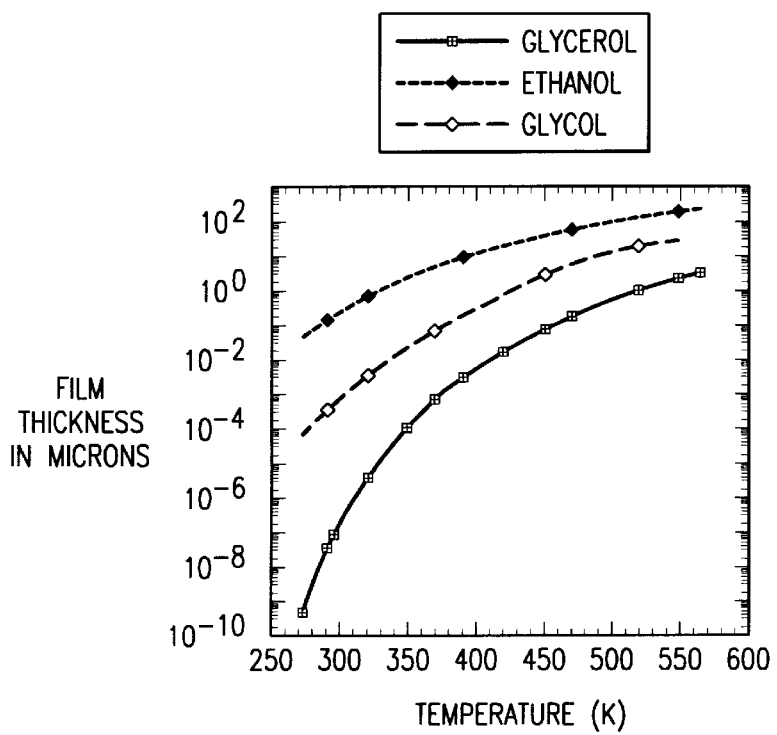
FIG. 14 contains a graph showing the shrinkage of a thin film when aged in a substantially closed chamber having a 1 mm clearance with the thin film.

The present invention allows high boiling point solvent gel processing at elevated temperatures, with acceptable shrinkage, by substantially enclosing the gel thin film in a relatively small, substantially closed chamber, at least during high-temperature aging. In operation, whatever evaporation does occur from the wafer raises the solvent saturation ratio of the atmosphere inside the closed chamber. At any given temperature, this evaporation continues until the partial pressure of the vapor increases enough to equal the vapor pressure of the liquid. Thus, solvent/temperature combinations with lower vapor pressure solvent will not allow as much liquid solvent to evaporate as a higher vapor pressure solvent combination allows. FIG. 12 shows how vapor pressure varies with temperature for several solvents. If the chamber size is known, the amount of evaporation can be calculated. FIG. 13 shows an estimate of how thick of a layer of solvent could potentially be evaporated from a 70% porous gel placed in a closed chamber with a 5 mm high airspace above the wafer. FIG. 14 shows a similar estimate for a chamber with a 1 mm high airspace above the wafer. These figures show that, with a 5 mm high airspace, the 20 nm preliminary goal is feasible up to 50° C. for ethylene glycol-based gels and up to 120° C. for glycerol-based gels. With the 1 mm airspace, the 20 nm goal is feasible up to 80° C. for the ethylene glycol-based gels and 150° C. for the glycerol-based gels. Of course, lower temperature processing allows less evaporation. Volumetric evaporation control using the 1 mm chambers allows correspondingly less than 1 nm of thickness loss for both ethylene glycol-based and glycerol-based gels at 20° C.

Figure 16A:
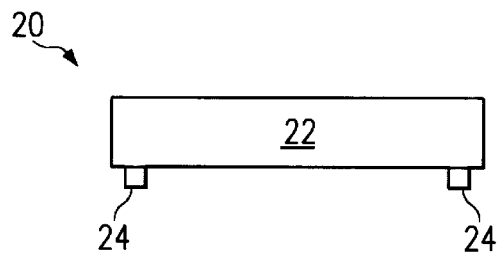
FIGS. 16A and 16B contain, respectively, a cross-sectional and a plan view of a sol-gel thin film processing apparatus according to the present invention.
Figure 16B:
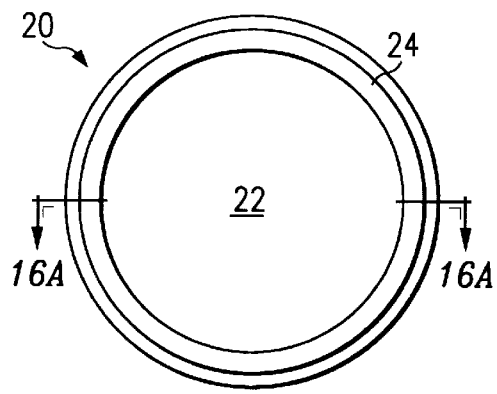
Figure 16C:
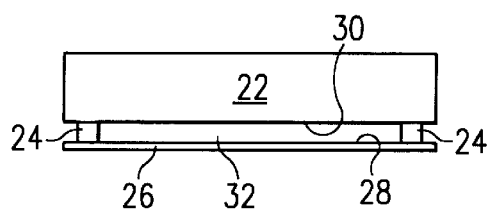
FIG. 16C contains a cross-sectional view of the same apparatus in contact with a substrate.

One embodiment of the present invention is illustrated in FIGS. 16A, 16B and 16C. In this embodiment, a processing apparatus comprises a body 20, having a substantially planar plate 22 with a resilient seal 24 attached thereto. Plate 22 need only be planar to the extent necessary to provide clearance with a thin film during operation, and may be constructed of any material compatible with semiconductor fabrication, although materials with high thermal conductivity, such as stainless steel, glass, or aluminum are preferred. Resilient seal 24 should preferably be designed to withstand wet gel processing temperatures and pore fluids; many suitable TEFLON- or neoprene-based materials are known to those with ordinary skill in the art. Depending on the nature of temperature control used in the apparatus, it may be preferable to have seal 24 be either substantially thermally insulating or thermally conductive.

In operation, body 20 may simply be rested on a substrate 26, as shown in FIG. 16C. In this embodiment, seal 24 functions both as an atmospheric seal and as a spacer which sets the volume of chamber 32 formed by substrate surface 28, chamber surface 30 and seal 24. For example, seal 24 may be designed to compress to a thickness of about 1 mm under the weight of plate 22, thus creating chamber 32 with a 1 mm height when body 20 is placed on substrate 26. For many thin film applications, chamber 32 need only be substantially sealed, as some small degree of vapor leakage over the course of processing substrate 26 will not appreciably affect the final film properties.

Body 20 finds application at many points in an aerogel thin film process. It may be used to limit evaporation before a sol film has gelled, as an aging chamber for wet gel thin films, as a storage or transport chamber for such films, or as a drying chamber. In all of these applications, it is recognized that both sol and gel thin films contain extremely small amounts of liquid, such that a chamber of limited volume is necessary to prevent substantial evaporation from the film.

Figure 17A:
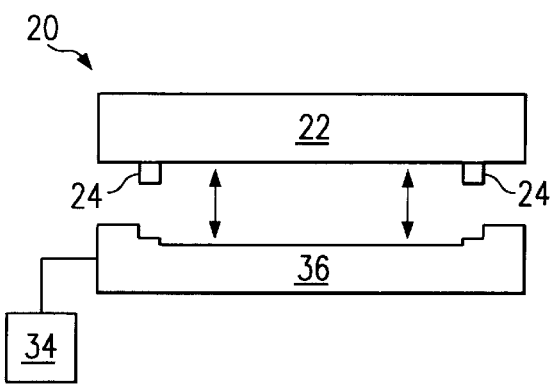
FIGS. 17A and 17B contain, respectively, cross-sectional views of another apparatus according to the present invention, empty and enclosing a substrate.
Figure 17B:
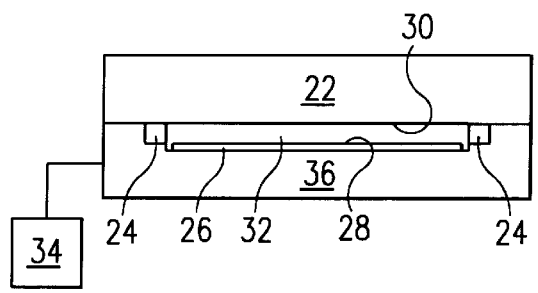

In another embodiment, body 20 may comprise more elements, as shown in FIGS. 17A and 17B. In this embodiment, body 20 additionally comprises a substrate holder 36 and substrate temperature control means 34. This embodiment shows the additional aspect of a seal 24 located outboard of the substrate (or in some cases seal 24 may even be deleted), such that a thin film may be formed on the entirety of substrate surface 28. When chamber 32 is closed, planar plate 22 and wafer holder 36 may be thermally coupled such that temperature control means 34 may be used to simultaneously regulate the temperature of body 20, substrate 26 and chamber 32.

Figure 18A:
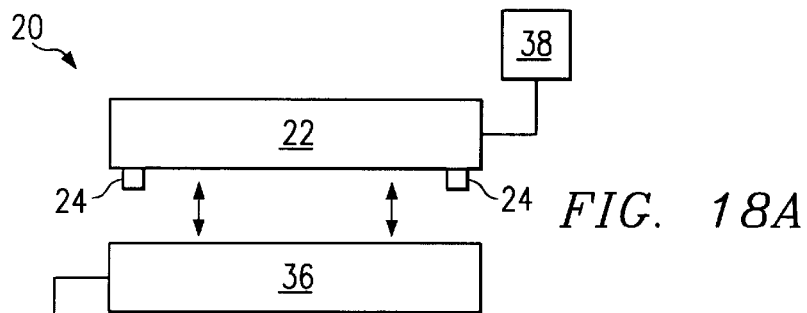
FIGS. 18A and 18B contain, respectively, cross-sectional views of yet another apparatus according to the present invention, empty and enclosing a substrate.
Figure 18B:
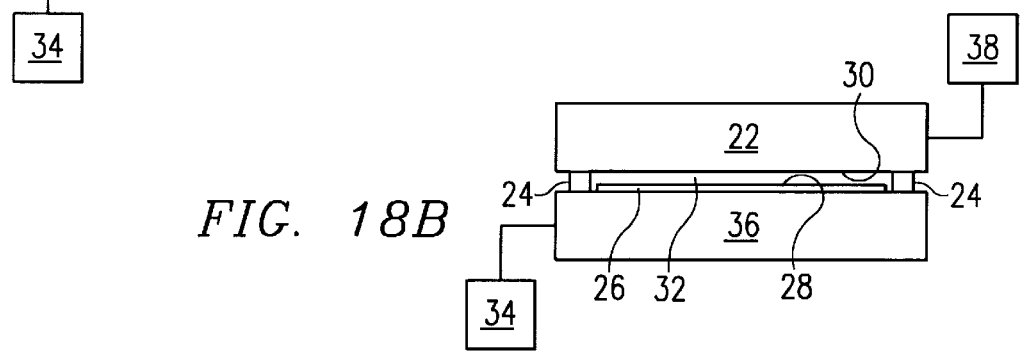

In another embodiment shown in FIGS. 18A and 18B, seal 24 provides some degree of thermal isolation between planar plate 22 and wafer holder 36. This allows temperature control means 34 to control substrate temperature, while separate temperature control means 38 are used to control planar plate temperature. Such an embodiment may have an advantage for drying a wet gel film, as the temperature of planar plate 22 can be selectively lowered to promote condensation on chamber surface 30.

Figure 19A:
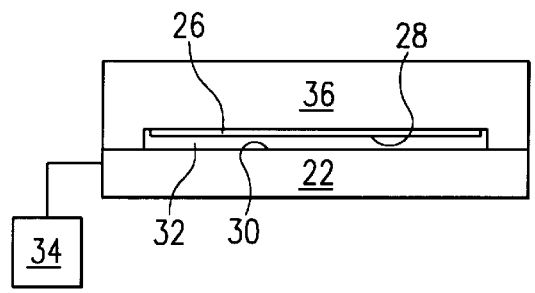
FIGS. 19A, 19B and 19C contain cross-sectional views of additional apparatus configurations which illustrate other aspects of the invention.
Figure 19B:
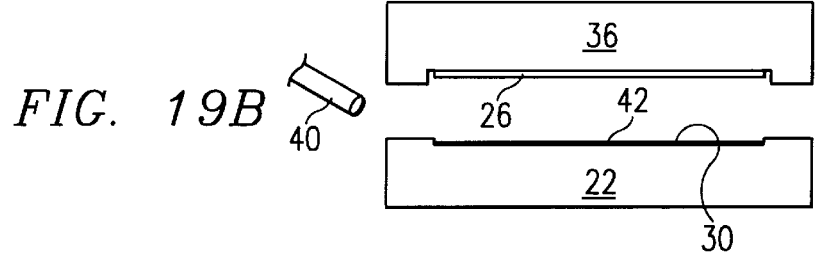
Figure 19C:
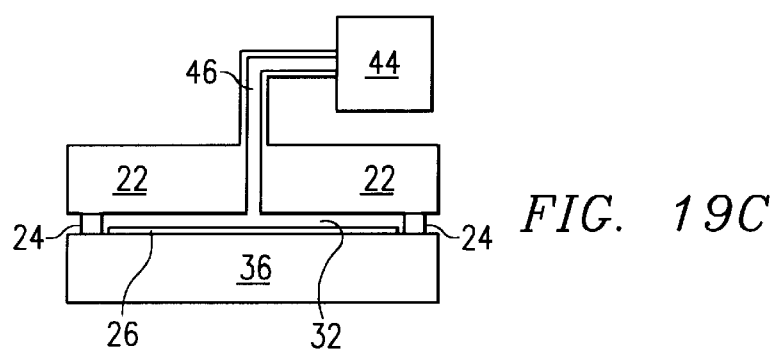

FIGS. 19A, 19B and 19C show additional aspects of the invention. For example, in FIG. 19A, substrate 26 is shown being processed in an inverted position. In this embodiment, accidental or purposeful condensation onto chamber surface 30 may be collected without the possibility of such condensation dropping onto substrate surface 26. In FIG. 19B, not only is substrate 26 processed inverted, but a first solvent layer 42 (preferably of the same composition as at least one pore fluid) is dispensed, e.g. from a first solvent supply tube 40, onto chamber surface 30 prior to closing the chamber. In this embodiment, layer 42 may be used to help saturate the processing atmosphere, resulting in less evaporation of pore fluid from substrate 26.

In FIG. 19C, an embodiment is shown wherein some atmospheric adjustment means 44 is connected through at least one port 46 (which may be closeable) to chamber 32. Atmospheric adjustment means 44 may be used to create a vacuum or to overpressure chamber 32 as appropriate, or to exchange the atmosphere in chamber 32, or to supply a pore fluid vapor to chamber 32. This embodiment may be used, for example, to age a thin film at a temperature higher than the boiling point of a pore fluid, by operating chamber 32 at above atmospheric pressure. This embodiment may also be used to remove at least a portion of the pore fluid vapor from chamber 32 after aging, thereby allowing the thin film to dry.

Figure 8A:
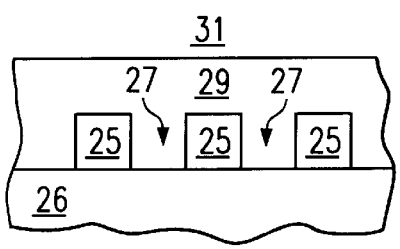
FIGS. 8A–8B contain cross-sections of a semiconductor substrate at several points during deposition of a thin film which may be fabricated using the present invention.

Also in accordance with the present invention, several preferred embodiments for thin film nanoporous dielectric deposition methods are presented herein. Referring now to FIG. 8A, a semiconductor substrate 26 (typically in wafer form) is shown. Common substrates include silicon, germanium, and gallium arsenide, and the substrate may include active devices, lower level wiring and insulation layers, and many other common structures not shown but known to those skilled in the art. Several patterned conductors 25 (e.g., of an Al-0.5% Cu composition) are shown on substrate 26. Conductors 25 typically run parallel for at least part of their length, such that they are separated by gaps 27 of a predetermined width (typically a fraction of a micron). Both the conductors and gaps may have height-to-width ratios much greater than shown, with larger ratios typically found in devices with smaller feature sizes.

Figure 8B:
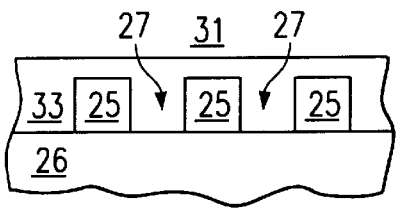

In accordance with a first nanoporous dielectric method, 61.0 mL tetraethylorthosilicate (TEOS), 61.0 mL glycerol, 4.87 mL water, and 0.2 mL 1M $HNO_3$ are mixed and refluxed for 1.5 hours at 60° C. After a cooling period, the solution may be diluted down with ethanol to a composition of 80% (by volume) original stock solution and 20% (by volume) ethanol, thus reducing the viscosity. This is mixed vigorously and typically stored in a refrigerator at 7° C. to maintain stability until use. The solution is warmed to room temperature prior to film deposition. 3–5 mL of this precursor sol may be dispensed at room temperature onto substrate 26, which is then spun at 1500 to 5000 rpm (depending on desired film thickness) for about 5–10 seconds to form sol thin film 29. The deposition can be performed in an atmosphere that has no special control of solvent saturation (e.g., in a cleanroom with standard humidity controls). During and after this deposition and spinning, the ethanol/water azeotropic mixture is evaporating from film 29, but due to glycerol's low volatility, no substantial evaporation of the glycerol is occurring. This evaporation shrinks thin film 29 and concentrates the silica content of the sol forming reduced thickness film 33. FIG. 8B shows a reduced thickness sol film 18 obtained after substantially all (about 95% or more) of the ethanol has been removed. This concentrated sol typically gels within minutes or seconds.

Film 33 has an approximately known volume ratio of silica to pore fluid at the gel point. This ratio is approximately equal to the ratio of TEOS to glycerol in the as-deposited sol (with minor changes due to remaining water, continued reactions and incidental evaporation). To the extent that the gel is prevented from collapsing, this ratio will determine the density of the aerogel film that will be produced from the sol thin film.

After gelation, the thin film wet gel 33 comprises a porous solid and a pore fluid. The pore fluid may preferably be left in place, although it may be diluted or replaced by a different fluid (e.g. replace glycerol and water mixture with glycerol). Whether this fluid is identical to the as-gelled fluid or not, the pore fluid that is present during aging is sometimes referred to as "aging fluid". Aging is most preferably carried out in one of the limited volume chambers of the present invention, e.g. for about 1 minute at 130–150° C., although temperatures in the range of 25° C. to 200° C., as well as aging times as short as several seconds or as long as one day are also comprehended. It should be noted that the pore fluid changes somewhat during processing. These changes may be due to continued reactions, evaporation, condensation, or chemical additions to the thin film.

After aging, wet gel film 33 may be dried without substantial densification by one of several methods, including supercritical fluid extraction. However, with polyol-based gels, one alternative is to use a solvent exchange to replace the aging fluid with a drying fluid and then air dry the film 33 from this drying fluid. This drying method uses a solvent exchange to dilute the aging fluid or replace it with a different fluid (e.g. use a large volume of acetone to dilute the glycerol and water mixture, thus forming a mixture dominated by acetone). Whether this fluid is identical to the aging fluid or not, the pore fluid that is present during drying is sometimes referred to as "drying fluid". If used, the solvent exchange replaces the aging fluid that is dominated by the glycerol and its associated high surface tension with a drying fluid that has a lower surface tension. This solvent exchange may preferably be carried out by dispensing approximately 5–8 mL of acetone at room temperature onto aged thin film 18, then spinning the wafer between approximately 250 and 500 rpm for about 5–10 seconds. In this solvent exchange method, it is preferred to remove nearly all the glycerol before drying. The drying fluid (acetone in this case) is finally allowed to evaporate from the wet gel 18, forming a dry porous dielectric (dried gel).

An alternate method may be used to age and dry, e.g. glycerol-based, films without solvent exchange using a limited volume chamber 32. An unaged wafer is placed in a temperature-controlled limited volume chamber, preferably at room temperature and ambient pressure. The chamber remains substantially sealed as the temperature is ramped up, aging the film. After the chamber reaches a temperature at which the glycerol surface tension is low enough such that the aged film is sufficiently strong to withstand capillary drying pressures, a process is begun that removes glycerol from the chamber atmosphere. Note that the preferred drying temperature, in many applications, is greater than the boiling point of glycerol, in which case the chamber should be pressurized before the boiling point is reached. Also, care should be taken that the glycerol in the chamber atmosphere is, especially at first, slowly removed. The glycerol in the chamber atmosphere may, e.g., be removed by bleeding off the pressure, by vacuum pumping, by sweeping the glycerol off with an annealing gas (e.g. forming gas), or by forcing condensation on chamber wall 30 (see, e.g. the configuration of FIG. 19C). The chamber temperature may be held constant or it may continue to be raised while the glycerol is being removed (the chamber may be ramped on up to annealing temperature while sweeping the glycerol off with the annealing gas). While some glycerol can be introduced during initial heating to minimize evaporation from the film (until a temperature has been reached where the surface tension of the fluid is sufficiently reduced), preferably the chamber volume is low enough that evaporation does not significantly reduce film thickness even without the introduction of glycerol during heating.

After sufficient aging, the fluid can be evaporated, e.g. without cooling, or the substrate cooled before drying, as condensation does not pose a serious problem after sufficient aging. As the thin film becomes predominately dry (typically within seconds), the temperature should preferably then be increased above the boiling point of both the aging fluid and the drying fluid. This method prevents destructive boiling, yet insures that all fluid is removed.

In order to reduce the dielectric constant, it is preferable to dehydroxylate (anneal) the dried gel. This may be done by placing the wafer in a forming gas atmosphere comprised of 10 volume % H2, 90 volume % N2 at atmospheric pressure, and baking at 450 C. for approximately 30 minutes. Other anneals can also be used in place of or in conjunction with the dehydroxylating anneal.

In accordance with a second, ethylene glycol-containing sol aerogel process, mix tetraethylorthosilicate (TEOS), ethylene glycol, ethanol, water, and acid (1M $HNO_3$) in a molar ratio of 1:2.4:1.5:1:0.042 and reflux for 1.5 hours at 60° C. After the mixture is allowed to cool, the solution is diluted down with ethanol to a composition of 70% (by volume) original stock solution and 30% (by volume) ethanol. This is mixed vigorously and typically stored in a refrigerator at 7° C. to maintain stability until use. The solution is warmed to room temperature prior to film deposition. A mixture of stock solution and 0.25M $NH_4OH$ catalyst (10:1 volume ratio) is combined and mixed. This sol may be deposited on substrate 26 in the manner described in conjunction with the glycerol solvent embodiment.

Figure 9:
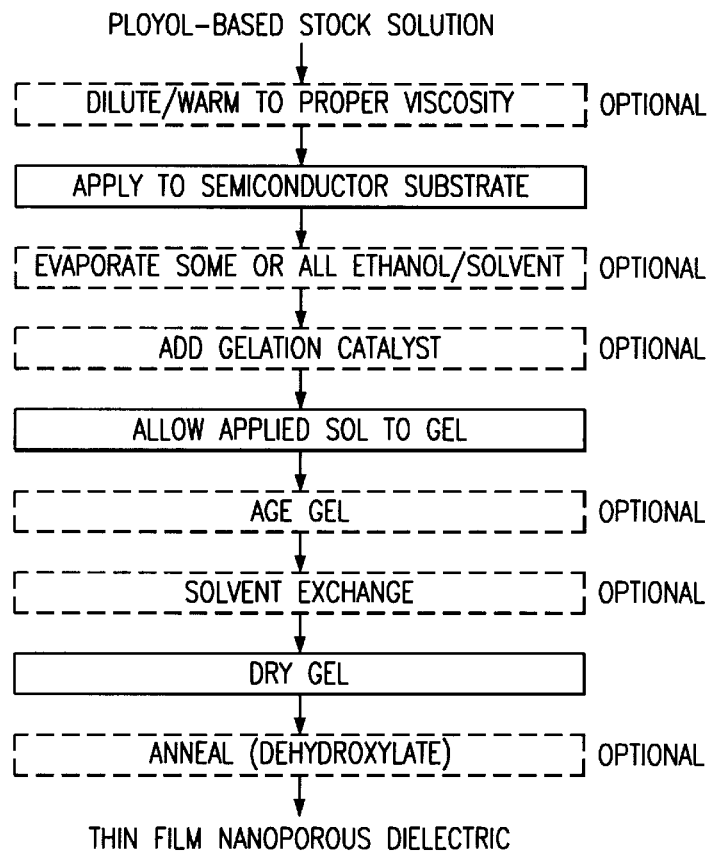
FIG. 9 is a flow chart of a deposition process for a nanoporous dielectric which utilizes the present invention.

FIG. 9 contains a flow chart of a general method for obtaining an aerogel thin film from a precursor sol according to one embodiment of the present invention. Table 5 is a quick summary of some of the substances used in this method.

TABLE 5

Substance Summary

| Ref # | Specific Example | Functional Description | Preferred Alternates |
|---|---|---|---|
| 10 | Silicon | Semiconductor Substrate | Ge, GaAs, active devices, lower level layers |
| 12 | Al-0.5% Cu | Patterned Conductors | Al, Cu, other metals, polysilicon |
|  | TEOS | Precursor Sol Reactant | Other silicon-based metal alkoxides (TMOS, MTEOS, BTMSE, etc.), alkoxides of other metals, particulate metal oxides, organic precursors, and combinations thereof |
|  | Glycerol | Precursor Sol First Solvent (Low volatility) | Other polyols, combinations of glycerol, Ethylene glycol, 1,4-butylene glycol, 1,5-pentanediol, and/or other polyols. |
|  | Nitric Acid ($HNO_3$) | Precursor Sol Stabilizer | Other acids |
|  | Ethanol | Precursor Sol Second Solvent (High volatility) | Methanol, other alcohols |
|  | Ethanol | Viscosity Reduction Solvent | Methanol, other alcohols |
|  | TMCS | Surface Modification Agent | Hexamethyldisilazane (HMDS), trimethylmethoxysilane, dimethyl-dimethoxysilane, phenyl compounds and fluorocarbon compounds. |

TABLE 5-continued

Substance Summary

| Ref # | Specific Example | Functional Description | Preferred Alternates |
|---|---|---|---|
|  | Ammonium Hydroxide ($NH_4OH$) | Gelation Catalyst | Ammonia, volatile amine species, volatile fluorine species, and other compounds that will raise the pH of the deposited sol. Nitric acid and other compounds that will lower the pH. |
|  | As-Gelled Pore fluid | Aging Fluid | Glycerol, ethylene glycol, other polyols, water, ethanol, other alcohols, combinations thereof. |
|  | Acetone | Drying Fluid | Aging fluid, heated aging fluid, heptane, isopropanol, ethanol, methanol, 2-ethylbutyl alcohol, alcohol/water mixtures, ethylene glycol, other liquids that are miscible with the aging fluid, yet have lower surface tension than the aging fluid, combinations thereof. |

Figure 15:
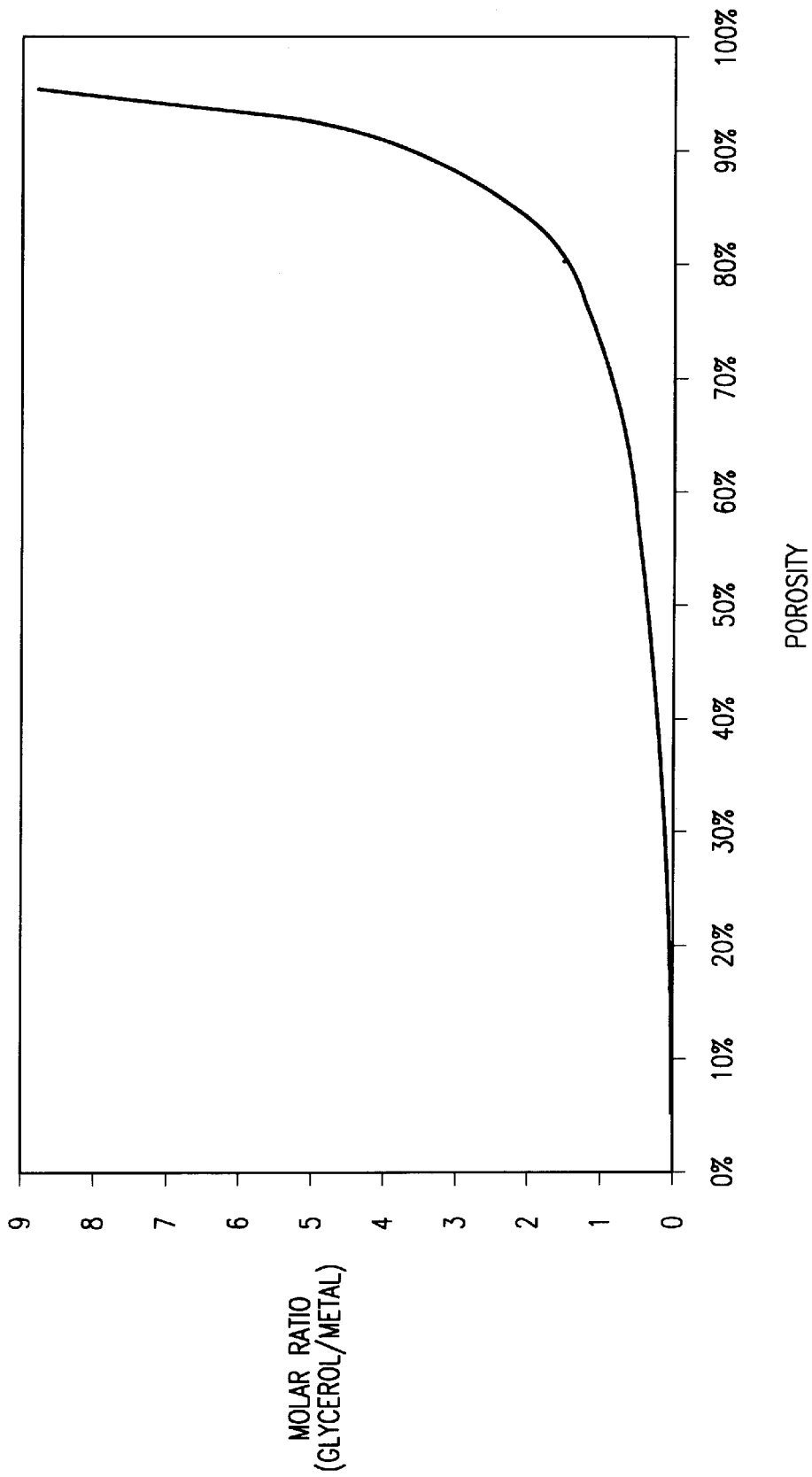
FIG. 15 contains a graph of the theoretical molar ratio of glycerol molecules to metal oxide molecules vs. porosity of a nanoporous dielectric.

Other ratios of solvent to reactant ratios can be used to provide different porosities. FIG. 15 shows the theoretical relationship between the molar ratio of glycerol molecules to metal oxide molecules and the porosity of a nanoporous dielectric for the case where all ethanol is evaporated from the deposited sol. However, the lower porosity gels require care to prevent early gelation. This may comprise pH adjustment, temperature control, or other methods known in the art. In some applications, it is also permissible to allow ethanol evaporation after gelation.

Figure 10:
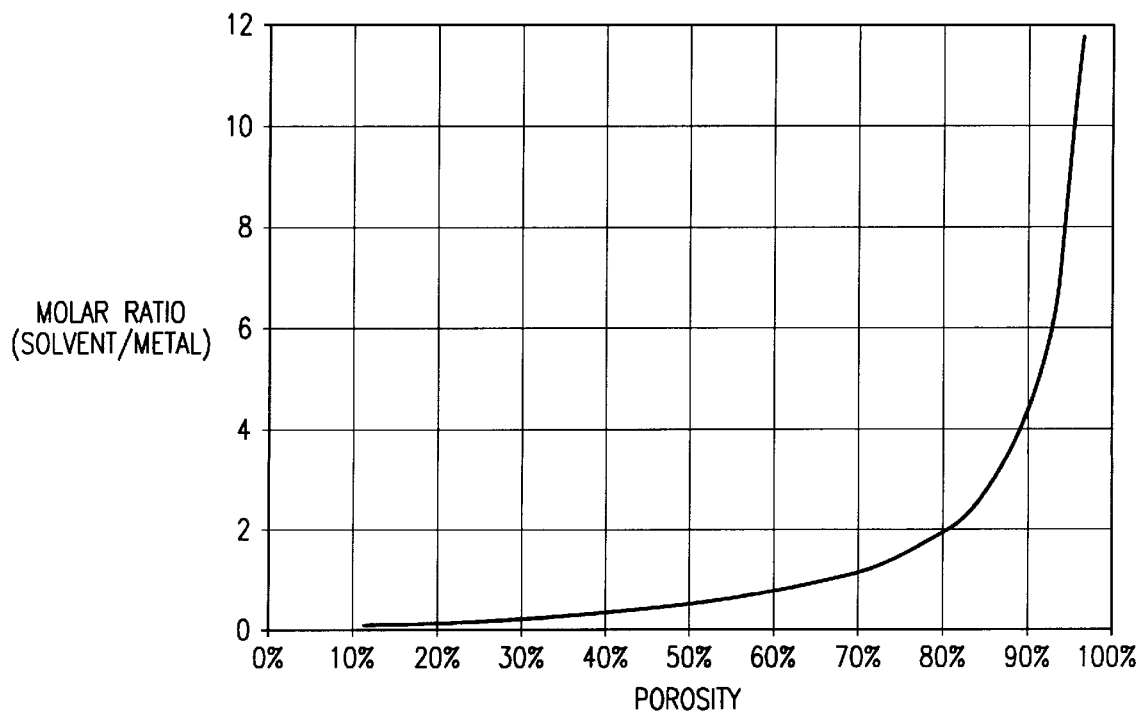
FIG. 10 contains a graph of the theoretical molar ratio of first solvent molecules to metal atoms vs. porosity of a nanoporous dielectric which may be fabricated using the present invention.

Other ratios of solvent to reactant ratios can be used to provide different porosities. FIG. 10 shows the theoretical relationship between the molar ratio of ethylene glycol molecules to metal oxide molecules and the porosity of a nanoporous dielectric for the case where all ethanol is evaporated from the deposited sol. However, the lower porosity gels may require care to prevent early gelation. This may comprise pH adjustment, temperature control, or other methods known in the art. In some applications, it is also permissible to allow ethanol evaporation after gelation.

Although this invention has been described in terms of several embodiments, many steps may be modified or combined within the scope of the invention, and other steps can be included to enhance the overall process. For example, the initial thin film may be deposited by other common methods, such as dip-coating or spray-coating instead of spin-coating. Likewise, the solvent exchange may use dip coating, spray coating, or immersion in a liquid or vaporous solvent instead of spin-coating. When using a high vapor pressure solvent, the wafer may be cooled to a temperature lower than the atmosphere, thus promoting condensation on the wafer. While water might be considered a solvent in such a process, for discussion purposes in this application, water is not considered a solvent.

By modifying the mix ratios of polyol and alcohol in the sol-gel process, the gel's properties can be changed. One such change is the gel time. Table 6 below shows the results of varying the ethanol to ethylene glycol ratios in the precursor sol of some sample bulk gels with catalysts. These gels generally used the same sol mixture as the ethylene glycol embodiment except for the ethanol to ethylene glycol ratio. Also, in the non-polyol-based mix, the catalyst concentration is different. This non-polyol-based gel used 0.5 M $NH_4OH$ catalyst in a volume ratio of 1:10, instead of the 0.25 M $NH_4OH$ used in the others.

TABLE 6

Effect of Varying the Ethylene Glycol Content of the Precursor Sol

| Bulk Example # | Ethanol Content (mL) | Ethylene Glycol Content (mL) | Gel Time (minutes) |
| --- | --- | --- | --- |
| 1 (Non-Polyol-Based) | 61 | 0 | 7 to 10 |
| 2 | 36.6 | 24.4 | 5 to 7 |
| 3 | 30.5 | 30.5 | 2 to 3 |
| 4 | 24.4 | 36.6 | 1 to 2 |
| 5 | 0 | 61 | 1 to 2 |

Another example of modification to the basic method is that, before drying (and typically, but not necessarily, after aging), the thin film wet gel 29 may have its pore surfaces modified with a surface modification agent. This surface modification step replaces a substantial number of the molecules on the pore walls with those of another species. If a surface modifier is applied, it is preferable to remove the water from the wet gel 29 before the surface modifier is added. The water can be removed by immersing the wafer in pure ethanol, preferably by a low speed spin coating as described in the solvent exchange in the first process example. This water removal could be beneficial, because water will react with many surface modification agents, such as TMCS; however, it is not necessary. With a polyol-based method, surface modification need not be performed to help lessen pore collapse, but it can be used to impart other desirable properties to the dried gel. Some examples of potentially desirable properties are hydrophobicity, reduced dielectric constant, increased resistance to certain chemicals, and improved temperature stability. Some potential surface modifiers that may impart desirable properties include hexamethyldisilazane (HMDS), the alkyl chlorosilanes (trimethylchlorosilane (TMCS), dimethyldichlorosilane, etc.), the alkylalkoxysilanes (trimethylmethoxysilane, dimethyldimethoxysilane, etc.), phenyl compounds and fluorocarbon compounds. The useful phenyl compounds will typically follow the basic formula, $Ph_xA_ySiB_{(4-x-y)}$, where, Ph is a phenolic group, A is a reactive group such as Cl or OCHs, and B are the remaining ligands which, if there are two, can be the same group or different. Some examples of these phenyl surface modification agents include compounds with I phenolic group such as phenyltrichlorosilane, phenyltrifluorosilane, phenyltrimethoxysilane, phenyltriethoxysilane, phenylmethylchlorosilane, phenylethyldichlorosilane, phenyldimethylethoxysilane, phenyldimethylchlorosilane, phenyldichlorosilane, phenyl (3-chloropropyl)dichlorosilane, phenylmethylvinylchlorosilane, phenethyldimethylchlorosilane, phenyltrichlorosilane, phenyltrimethoxysilane, phenyltris(trimethylsiloxy)silane, and phenylallyldichlorosilane. Other examples of these phenyl surface modification agents include compounds with 2 phenolic groups such as diphenyldichlorosilane, diphenylchlorosilane, diphenylfluorosilane, diphenylmethylchlorosilane, diphenylethylchlorosilane, diphenyldimethoxysilane, diphenylmethoxysilane, diphenylethoxysilane, diphenylmethylmethoxysilane, diphenylmethylethoxysilane and diphenyldiethoxysilane. These phenyl surface modification agents also include compounds with 3 phenolic groups such as triphenylchlorosilane, triphenylflourosilane, and triphenylethoxysilane. Another important phenyl compound, 1,3-diphenyltetramethyldisilazane, is an exception to this basic formula. These lists are not exhaustive, but do convey the basic nature of the group. The useful fluorocarbon based surface modification agents include (3,3,3-trifluoropropyl) trimethoxysilane), (tridecafluoro-1,1,2,2-tetrahydrooctyl)-1dimethylchlorsilane, and other fluorocarbon groups that have a reactive group, such as Cl or $OCH_3$, that will form covalent bonds with a hydroxyl group.

The paragraph above lists some of the typical useful properties for many conventional applications. However, there are other potential applications for nanoporous dielectrics and aerogels that may have different desirable properties. Examples of some other potentially desirable properties include hydrophilicity, increased electrical conductivity, increased dielectric breakdown voltage, increased reactivity with certain chemicals, and increased volatility. This list is not exhaustive. However, it shows that, depending upon the application, many different types of properties may be desirable. Thus, it is clear that many other materials that will form covalent bonds with hydroxyl groups are potential surface modifiers that may impart other potentially desirable properties.

This invention also comprises using gelation catalysts with the glycerol-based and other polyol-based sols, not just the ethylene glycol-based sols. This also includes the allowance of other gelation catalysts in place of the ammonium hydroxide and/or for the gelation catalyst to be added after deposition. Typically, these alternate catalysts modify the pH of the sol. It is preferable to use catalysts that raise the pH, although acid catalysts can be used. Typically, acid catalysis results in longer processing times and a denser dielectric than a base catalyzed process. Some examples of other preferred gelation catalysts include ammonia, the volatile amine species (low molecular weight amines) and volatile fluorine species. When the catalyst is added after deposition, it is preferable to add the catalyst as a vapor, mist, or other vaporish form.

Thus, this invention can allow production of nanoporous dielectrics at room temperature and atmospheric pressure, without a separate surface modification step. Although not required to prevent substantial densification, this new method does not exclude the use of supercritical drying or surface modification steps prior to drying. To the extent that the freezing rates are fast enough to prevent large (e.g. 50 nm) crystals, it is also compatible with freeze drying. In general, this new method is compatible with most prior art aerogel techniques. Although this new method allows fabrication of aerogels without substantial pore collapse during drying, there may be some permanent shrinkage during aging and/or drying. This shrinkage mechanism is not well understood; however, it behaves in a manner similar to syneresis.

Other examples of modifications involve the reaction atmosphere and/or temperature. Also coating and gelation need not be performed in the same chamber or even in the same atmosphere. For instance, coating may be done with a controlled ambient that prevents evaporation of low volatility components (particularly at higher temperatures where even the low volatility components evaporate more rapidly), or in an ambient that also prevents evaporation of high volatility components. Additionally, the substrate may have its temperature elevated to speed surface modification and/or gelation. Also, total pressure and/or temperature may be varied to further control evaporation rates and/or gel time. Elevated temperature processing is typically performed at no less than 40° C.; however, 50° C. is preferred, and 70° C. is more preferred. When working at elevated temperatures, care should be taken (e.g., the partial pressures in the reaction atmosphere should be high enough) to prevent solvent boiling.

Although TEOS has been used as a representative example of a reactant, other metal alkoxides may be used either alone or in combination with TEOS or each other to form a silica network These metal alkoxides include tetramethylorthosilicate (TMOS), methyltriethoxysilane (MTEOS), 1,2-Bis(trimethoxysilyl)ethane (BTMSE), combinations thereof, and other silicon-based metal alkoxides known in the art. A sol may also be formed from alkoxides of other metals known in the art such as aluminum and titanium. Some other precursor sols known in the art include particulate metal oxides and organic precursors. Two representative particulate metal oxides are pyrogenic (fumed) silica and colloidal silica. Some representative organic precursors are melamine, phenol furfural, and resorcinol. In addition to alternate reactants, alternate solvents may also be used. Some examples of preferred alternates for ethanol are methanol and the other higher alcohols. Other acids may be used as a precursor sol stabilizer in place of the nitric acid.

An additional modification to the basic process is to allow and/or promote the formation of moderate sized (15 to 150 monomers per molecule) oligomers in the precursor sol. These larger oligomers may speed the gelation process in the deposited sol. A sol containing large oligomers may have a higher viscosity than a sol with small oligomers. However, as long as the viscosity is stable, this higher viscosity can be compensated by methods known in the art, such as adjusting solvent ratios and spin conditions. To help achieve this desired stable viscosity, the oligomerization may need to be slowed or substantially halted before deposition. Potential methods of promoting oligomerization might include heating the precursor sol, evaporating solvent, or adding small amounts of a gelation catalyst such as ammonium hydroxide. Potential methods of retarding oligomerization might include cooling the precursor sol, diluting the sol with a solvent, or restoring the precursor sol to a pH that minimizes condensation and gelation (Nitric acid could be used in conjunction with the ammonium hydroxide exemplified above).

Although the present invention has been described with several sample embodiments, various changes and modifications may be suggested to one skilled in the art. It is intended that the present invention encompass such changes and modifications as fall within the scope of the appended claims.

What is claimed is:

1. An apparatus for processing a wet gel thin film deposited on a semiconductor substrate, said apparatus comprising:
    a body capable of substantially enclosing at least a first region of a substrate surface, said region having a wet gel thin film deposited thereon,
    said body having a chamber surface capable of being positioned substantially adjacent to said substrate surface without contacting said thin film in said first region, such that a chamber exists between said chamber surface and said first region, said chamber having a volume less than or equal to 5000 times the volume of said thin film in said first region; and
    means for controlling the temperature within said chamber;
    whereby evaporation of fluid from a wet gel thin film during processing and shrinkage of the film are substantially limited by processing in a limited-volume chamber.

2. The apparatus of claim 1, wherein said chamber volume is less than or equal to 1000 times the volume of said thin film in said first region.

3. The apparatus of claim 1, wherein said chamber volume is less than or equal to 500 times the volume of said thin film in said first region.

4. The apparatus of claim 1, wherein said body comprises a substantially planar plate and a resilient seal, arranged such that during engagement with a substrate, said seal is interposed between said plate and said substrate and encircles a first region of the substrate surface.

5. The apparatus of claim 1, wherein said body comprises a substantially planar plate and a substrate holder capable of being engaged with each other while said substrate holder holds a substrate.

6. The apparatus of claim 1, wherein said apparatus processes said substrates in an inverted position.

7. The apparatus of claim 6, further comprising means for supplying a layer of said first solvent to said chamber surface.

8. The apparatus of claim 1, wherein said means for controlling the temperature within said chamber comprise means for controlling the temperature of a substrate and separate means for controlling the temperature of said chamber surface.

9. The apparatus of claim 1, wherein said body further comprises at least one port into said chamber and means connected to said port for adjusting the atmosphere within said chamber.

10. The apparatus of claim 1, wherein said chamber surface is capable of being positioned such that said substrate surface and said chamber surface are separated by an average distance of not greater than 5 mm.

11. The apparatus of claim 1, wherein said chamber surface is capable of being positioned such that said substrate surface and said chamber surface are separated by an average distance of not greater than 1 mm.

12. The apparatus of claim 1, wherein said wet gel thin film contains a fluid principally comprising a polyol.

13. An aging chamber for aging a thin film wet gel deposited on a semiconductor substrate, said chamber comprising:
    a body capable of substantially enclosing at least a first region of a substrate surface, said region having a wet gel thin film wetted by at least a first solvent deposited thereon, such that said chamber has an atmospheric volume adjacent said wet gel thin film which, at a temperature selected in the range of 80° C. to 200° C., is substantially saturated by an amount of said first solvent equivalent to not greater than 5% of the volume of said first solvent contained in said wet gel thin film;
    whereby evaporation of fluid from a wet gel thin film during aging and shrinkage of the film are substantially limited by processing in a limited-volume chamber.

14. The chamber of claim 13, wherein said atmospheric volume is saturated by an amount of said first solvent equivalent to not greater than 1% of the volume of said first solvent contained in said wet gel thin film.

15. The chamber of claim 13, wherein said atmospheric volume is saturated by an amount of said first solvent equivalent to not greater than 0.5% of the volume of said first solvent contained in said wet gel thin film.

16. The chamber of claim 13, wherein said first solvent principally comprises a polyol.

* * * * *